(12) United States Patent
Arai et al.

(10) Patent No.: US 6,340,537 B1
(45) Date of Patent: Jan. 22, 2002

(54) ORGANIC ELECTROLUMINESCENT DEVICE

(75) Inventors: Michio Arai; Isamu Kobori; Etsuo Mitsuhashi, all of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/239,963

(22) Filed: Jan. 29, 1999

(30) Foreign Application Priority Data

Jan. 27, 1999 (JP) .......................................... 11-018775

(51) Int. Cl.$^7$ .......................... B62B 33/00; H05B 33/04
(52) U.S. Cl. ...................... 428/690; 313/504; 313/505; 313/506
(58) Field of Search ................................ 428/690, 917; 313/504, 506, 505

(56) References Cited

U.S. PATENT DOCUMENTS

| | | | | |
|---|---|---|---|---|
| 5,652,067 A | * | 7/1997 | Ito et al. ...................... | 428/690 |
| 5,853,905 A | | 10/1998 | So et al. ...................... | 428/690 |
| 5,869,929 A | * | 2/1999 | Eida et al. ................... | 313/501 |
| 5,909,081 A | * | 6/1999 | Eida et al. ................... | 313/504 |
| 5,952,779 A | | 9/1999 | Arai et al. ................... | 313/504 |
| 5,969,474 A | | 10/1999 | Arai ............................. | 313/504 |
| 5,981,092 A | | 11/1999 | Arai et al. ................... | 428/690 |
| 6,111,274 A | * | 8/2000 | Arai .............................. | 257/96 |
| 6,281,627 B1 | * | 8/2001 | Arai et al. ................... | 313/506 |
| 6,284,394 B1 | * | 9/2001 | Arai et al. ................... | 428/690 |

FOREIGN PATENT DOCUMENTS

| | | |
|---|---|---|
| EP | 0 740 489 | 10/1996 |
| JP | 9-260062 | 10/1997 |
| WO | WO 98/10473 | 3/1998 |
| WO | WO 00/10366 | 2/2000 |

OTHER PUBLICATIONS

S. Tokito, et al., Applied Physics Letters, vol. 66, No. 6, pp. 673–675, "Organic Electroluminescent Devices Fabricated Using a Diamine Doped MgF$_2$ Thin Film As A Hole–Transporting Layer," Feb. 6, 1995.

* cited by examiner

Primary Examiner—Cynthia H. Kelly
Assistant Examiner—Dawn Garrett
(74) Attorney, Agent, or Firm—Oblon, Spivak, McClelland, Maier & Neustadt, P.C.

(57) ABSTRACT

The organic EL device of the present invention fulfills the object of realizing an organic EL device which exhibits an excellent hole injecting efficiency and an improved light emitting efficiency and which can be operated at a low drive voltage and manufactured at a reduced cost. In order to attain such object, the organic EL device comprises a hole injecting electrode, a negative electrode, and one or more organic layers between the electrodes wherein at least one of said organic layers has a light emitting function. A high resistivity inorganic hole injecting layer is provided between said hole injecting electrode and the organic layer. This layer has conduction paths for electron blockage and hole transportation. An inorganic insulative electron injecting and transporting layer is provided between the light emitting layer and the negative electrode. This layer contains at least one oxide selected from strontium oxide, magnesium oxide, calcium oxide, lithium oxide, rubidium oxide, potassium oxide, sodium oxide and cesium oxide as its main component.

8 Claims, 2 Drawing Sheets

ORGANIC ELECTROLUMINESCENT DEVICE

BACKGROUND OF THE INVENTION

1. Technical Field

This invention relates to an organic electroluminescent (EL) device, and more particularly, to an inorganic/organic junction structure suitable for use in a device of the type wherein an electric field is applied to a thin film of an organic compound to emit light.

2. Background Art

In general, organic EL devices have a basic configuration including a glass substrate, a transparent electrode of ITO etc., a hole transporting layer of an organic amine compound, an organic light emitting layer of a material exhibiting electronic conductivity and intense light emission such as Alq3, and an electrode of a low work function metal such as MgAg, wherein the layers are stacked on the substrate in the described order.

The device configurations which have been reported thus far have one or more organic compound layers interposed between a hole injecting electrode and an electron injecting electrode. The organic compound layers are typically of two- or three-layer structure.

Included in the two-layer structure are a structure having a hole transporting layer and a light emitting layer formed between the hole injecting electrode and the electron injecting electrode and another structure having a light emitting layer and an electron transporting layer formed between the hole injecting electrode and the electron injecting electrode. Included in the three-layer structure is a structure having a hole transporting layer, a light emitting layer, and an electron transporting layer formed between the hole injecting electrode and the electron injecting electrode. Also known is a one-layer structure wherein a single layer playing all the roles is formed from a polymer or a mixed system.

Figure 3:
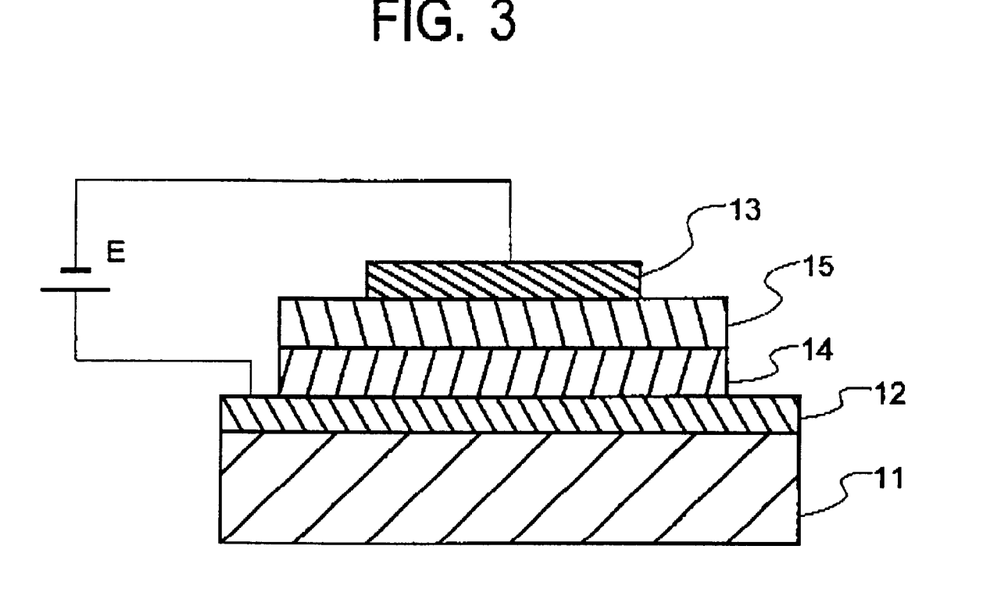
FIG. 3 is a schematic cross-sectional view illustrating an organic EL device of two layer structure having a hole transporting layer.
Figure 4:
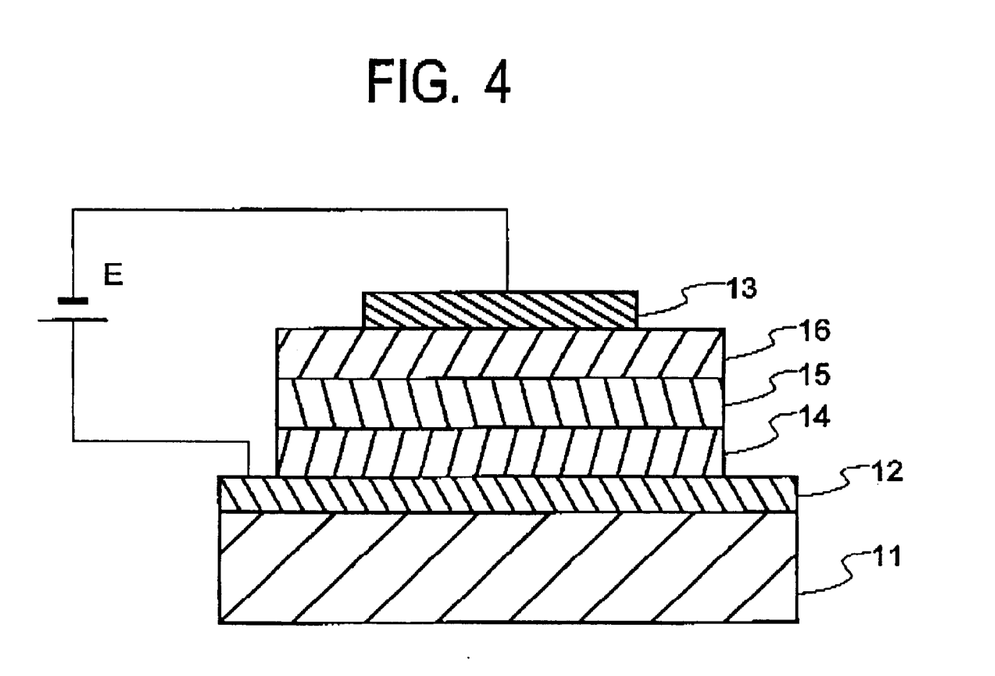
FIG. 4 is a schematic cross-sectional view illustrating an organic EL device of three layer structure having a hole transporting layer and an electron transporting layer.

FIGS. 3 and 4 illustrate typical configurations of organic EL devices.

In FIG. 3, a hole transporting layer 14 and a light emitting layer 15 of organic compounds are formed between a hole injecting electrode 12 and an electron injecting electrode 13 on a substrate 11. In this configuration, the light emitting layer 15 also serves as an electron transporting layer.

In FIG. 4, a hole transporting layer 14, a light emitting layer 15, and an electron transporting layer 16 of organic compounds are formed between a hole injecting electrode 12 and an electron injecting electrode 13 on a substrate 11.

Attempts have been made to improve the luminous efficiency of these organic EL devices. With the prior art device configuration, however, for reasons of poor hole blocking of the electron injecting and transporting layer, it was difficult to achieve efficient recombination of electrons with holes in the light emitting layer and hence, to provide a device with a fully satisfactory efficiency.

SUMMARY OF THE INVENTION

An object of the present invention is to provide an organic EL device having an excellent electron and hole injecting efficiency and improved light emitting efficiency, which can be manufactured at reduced cost and which can be operated at low drive voltage.

This and other objects are achieved by the present invention which is defined below.

(1) An organic electroluminescent device comprising a hole injecting electrode, a negative electrode, and at least one organic layer between the electrodes; wherein at least one of said at least one organic layer has a light emitting function;

a high resistivity inorganic hole injecting layer is provided between said hole injecting electrode and said organic layer, said high resistivity inorganic hole injecting layer capable of blocking the electrons and having hole conductive paths; and an inorganic insulative electron injecting and transporting layer is provided between said light emitting layer and said negative layer, said inorganic insulative electron injecting and transporting layer containing at least one oxide selected from strontium oxide, magnesium oxide, calcium oxide, lithium oxide, rubidium oxide, potassium oxide, sodium oxide and cesium oxide as its main component.

(2) The organic electroluminescent device of (1) wherein said high resistivity inorganic hole injecting layer has a resistivity of 1 to $1 \times 10^{11}$ Ω·cm.

(3) The organic electroluminescent device of (1) wherein said high resistivity inorganic hole injecting layer contains at least one member selected from a metal and/or its oxide, carbide, nitride, silicate and boride.

(4) The organic electroluminescent device of (1) wherein said high resistivity inorganic hole injecting layer comprises oxide of silicon and/or germanium as its main component, said main component having a composition represented by:

wherein $0 \leq x \leq 1$ and $1.7 \leq y \leq 2.2$, and said high resistivity inorganic hole injecting layer further comprises a metal having a work function of at least 4.5 eV or oxide thereof.

(5) The organic electroluminescent device of (4) wherein said metal is at least one member selected from Au, Cu, Fe, Ni, Ru, Sn, Cr, Ir, Nb, Pt, W, Mo, Ta, Pd and Co.

(6) The organic electroluminescent device of (4) wherein content of said metal and/or said metal oxide is in the range of 0.2 to 40 mol %.

(7) The organic electroluminescent device of (1) wherein said high resistivity inorganic hole injecting layer has a thickness of 1 to 100 nm.

(8) The organic electroluminescent device of (1) wherein said inorganic insulative electron injecting and transporting layer contains 80 to 99 mol % of the main component, and 1 to 20 mol % of the stabilizer, based on the entire components.

(9) The organic electroluminescent device of (1) wherein said inorganic insulative electron injecting and transporting layer has a thickness of 0.1 to 2 nm.

DESCRIPTION OF PREFERRED EMBODIMENTS

The organic electroluminescent device of the present invention comprises a hole injecting electrode, an electron injecting electrode, and one or more organic layers between the electrodes, and at least one of said organic layers has a light emitting function. A high resistivity inorganic hole injecting layer is disposed between the hole injecting layer and the organic layer and this layer is capable of blocking the electrons and having hole conductive paths. An inorganic insulative electron injecting and transporting layer is provided between the light emitting layer and the negative layer, and this inorganic insulative electron injecting and transporting layer contains at least one oxide selected from strontium oxide, magnesium oxide, calcium oxide, lithium oxide, rubidium oxide, potassium oxide, sodium oxide and cesium oxide as its main component.

By providing such high resistivity inorganic hole injecting layer which has hole conductive paths and which is capable of blocking the electrons between the organic layer and the hole injecting electrode, efficient hole injection into the light emitting layer is enabled to realize increased light emitting efficiency and reduced drive voltage.

In addition, by using oxide of a metal or a semimetal such as silicon or germanium for the main component of the high resistivity inorganic hole injecting layer, and additionally incorporating at least one member selected from a metal and a semimetal having a work function of at least 4.5 eV and preferably 4.5 to 6 eV, and oxide, carbide, nitride, silicate or boride thereof in the layer in order to form electroconductive paths, efficient hole injection from the hole injecting electrode to the organic layer on the side of the light emitting layer is realized. Electron migration from the organic layer to the hole injecting electrode is also suppressed, ensuring effective recombination of holes and electrons in the light emitting layer. The organic EL device of the invention has both the merits of the inorganic materials and the merits of the organic materials, and produces a luminance equal to or greater than that of prior art devices having an organic hole injecting layer. Owing to high heat resistance and weather resistance, the organic EL device of the invention has a longer service life than the prior art devices and develops minimal leaks and dark spots. Since not only a relatively expensive organic material, but also an inexpensive, readily available, easy-to-prepare inorganic material are used, the cost of manufacture can be reduced.

The high resistivity inorganic hole injecting layer may preferably have a resistivity of 1 to $1 \times 10^{11}$ Ω·cm, and more preferably, a resistivity of $1 \times 10^3$ to $1 \times 10^8$ Ω·cm. When the resistivity of the high resistivity inorganic hole injecting layer is within such range, hole injection efficiency can be drastically increased without detracting from the high electron blockage. The resistivity of the high resistivity inorganic hole injecting layer can also be determined from sheet resistance and the thickness, and in such a case, the sheet resistance can be measured, for example, by four terminal method.

The high resistivity inorganic hole injecting layer contains as its main component a composition represented by:

$(Si_{1-x}Ge_x)O_y$ wherein $0 \leq x \leq 1$, and $1.7 \leq y \leq 2.2$ and preferably $1.7 \leq y \leq 1.99$. The high resistivity inorganic hole injecting layer may be a thin film of silicon oxide or germanium oxide or a mixture of silicon oxide and germanium oxide. If y is outside this range, the layer is likely to exhibit a reduced hole injecting capability. The composition may be determined by an appropriate chemical analysis.

Preferably, the high resistivity inorganic hole injecting layer may further include oxide, carbide, nitride, silicate or boride of a metal (including a semimetal) having a work function of at least 4.5 eV. The metal having a work function of at least 4.5 eV, and preferably 4.5 to 6 eV is preferably at least one member selected from Au, Cu, Fe, Ni, Ru, Sn, Cr, Ir, Nb, Pt, W, Mo, Ta, Pd and Co. Such metal is generally present as a metal or a metal oxide, and carbide, nitride, silicate or boride of such metal may also be employed. When used as a mixture, they may be used at an appropriate mix ratio. The content is preferably 0.2 to 40 mol %, and more preferably 1 to 20 mol %. The content less than such range results in reduced hole injecting function while the content in excess of such range results reduced electron blocking function. When used as a mixture, the total content of the mixture is preferably within the range as described above.

The metal, or the oxide, carbide, nitride, silicate or boride of the metal (which may be a semimetal) as described above is generally dispersed in the high resistivity inorganic hole injecting layer, and the dispersed particles have a typical particle size of about 1 to about 5 nm. The conductive dispersed particles form hopping paths in the high resistivity main component, and the holes are transported along such hopping paths.

The high resistivity inorganic hole injecting layer may further contain as impurities hydrogen as well as neon, argon, krypton, xenon and other elements which are used as the sputtering gas in a total amount of up to 5 at %.

As long as the overall high resistivity inorganic hole injecting layer has the above-described composition on the average, the layer need not be uniform in composition and may be of a structure having a graded concentration in the thickness direction.

The high resistivity inorganic hole injecting layer is normally amorphous.

The thickness of the high resistivity inorganic hole injecting layer is preferably 1 to 100 nm, and more preferably about 5 to about 30 nm. Function as the hole injecting layer would become insufficient when the thickness of the high resistivity inorganic hole injecting layer is outside the range.

Methods for preparing the high resistivity inorganic hole injecting layer include various physical and chemical thin film forming methods such as sputtering and vapor deposition, with the sputtering being preferred. The sputtering is preferably conducted by multi-target sputtering wherein the target for the main component and the target for the metal oxide or the like are separately sputtered since such multi-target sputtering enables independent selection of the optimal sputtering procedure for each target. In the case of single-target sputtering, a small piece of the metal or the metal oxide may be placed on the target of the main component and the composition may be adjusted by appropriately adjusting the area ratio of the main component target and the piece placed on the main component target.

When the high resistivity inorganic hole injecting layer is formed by sputtering, the sputtering gas is preferably under a pressure of 0.1 to 1 Pa during sputtering. The sputtering gas may be any of inert gases used in conventional sputtering equipment, for example, Ar, Ne, Xe, and Kr. Nitrogen ($N_2$) gas may be used if necessary. Reactive sputtering may be carried out in an atmosphere of the sputtering gas mixed with about 1 to about 99% of oxygen ($O_2$) gas.

The sputtering process may be an RF sputtering process using an RF power source or a DC reactive sputtering process, with the RF sputtering being especially preferred. The power of the sputtering equipment is preferably in the range of 0.1 to 10 W/cm² for RF sputtering. The deposition rate is preferably in the range of 0.5 to 10 nm/min., especially 1 to 5 nm/min.

The temperature of the substrate during deposition is from room temperature (25° C.) to about 150° C.

In the organic electroluminescence device of the present invention, an inorganic insulative electron injecting and transporting layer is also provided between the light emitting layer and the negative layer Since the inorganic insulative electron injecting and transporting layer and the high resistivity inorganic hole injecting layer respectively comprising inorganic materials are provided to sandwich the light emitting layer, the organic EL device of the invention has both the advantages of inorganic materials and the advantages of organic materials. In other words, physical properties are stabilized at the boundary between the light emitting layer and the inorganic insulative electron injecting layer and the boundary between the light emitting layer and the high resistivity inorganic hole injecting and transporting layer, and the production is facilitated. The organic EL device of the invention produces a luminance comparable to those of prior art devices having an organic hole injecting layer and an organic electron injecting layer. Owing to high heat resistance and weather resistance, the organic EL device of the invention has a longer service life than the prior art devices and develops minimal leaks and dark spots. The use of an inexpensive, readily available inorganic material rather than relatively expensive organic materials offers the advantages of easy manufacture and reduced manufacture cost.

The inorganic insulative electron injecting and transporting layer has the functions of facilitating injection of electrons from the negative electrode, transporting electrons stably, and obstructing holes. This layer is effective for increasing the number of holes and electrons injected into the light emitting layer and confining holes and electrons therein for optimizing the recombination region to improve luminous efficiency.

By constituting the inorganic insulative electron injecting and transporting layer from the main component as described above and the like, a metal electrode which has a relatively high stability and high conductivity can be used since there is no particular need to form an electrode which has electron injecting function. As a consequence, the device exhibits improved electron injecting efficiency and light emitting efficiency, as well as prolonged service life.

The inorganic insulative electron injecting and transporting layer contains at least one oxide selected from the group consisting of lithium oxide ($Li_2O$), rubidium oxide ($Rb_2O$), potassium oxide ($K_2O$), sodium oxide ($Na_2O$), cesium oxide ($Cs_2O$), strontium oxide (SrO), magnesium oxide (MgO), and calcium oxide (CaO) as the main component. These oxides may be used alone or in admixture of two or more. The mixture of two or more oxides may have an arbitrary mix ratio. Of these oxides, the most preferred is strontium oxide, and magnesium oxide, calcium oxide and lithium oxide ($Li_2O$) are also preferred in this order, and then, rubidium oxide ($Rb_2O$), potassium oxide ($K_2O$), sodium oxide ($Na_2O$) are preferred in this order. When these oxides are used in admixture, the mixture should preferably contain at least 40 mol % of strontium oxide or at least 40 mol % and especially at least 50 mol % in total of lithium oxide and rubidium oxide.

The inorganic insulative electron injecting and transporting layer contains silicon oxide ($SiO_2$) and/or germanium oxide ($GeO_2$) as a stabilizer. Either one or both of silicon oxide and germanium oxide may be used. The mixture of silicon oxide and germanium oxide may have an arbitrary mix ratio.

These oxides are generally present in stoichiometric composition, but may deviate more or less therefrom and take non-stoichiometric compositions.

Also preferably, the inorganic insulative electron injecting and transporting layer according to the invention contains the respective components in the following amounts:

main component: 80 to 99 mol %, more preferably 90 to 95 mol %, stabilizer: 1 to 20 mol %, more preferably 5 to 10 mol %, based on the entire components, provided that the respective components are calculated as SrO, MgO, Cao, $Li_2O$, $Rb_2O$, $K_2O$, $Na_2O$, $Cs_2O$, $SiO_2$, and $GeO_2$.

The inorganic insulative electron injecting and transporting layer preferably has a thickness of 0.1 to 2 nm, and more preferably 0.3 to 0.8 nm.

Figure 1:
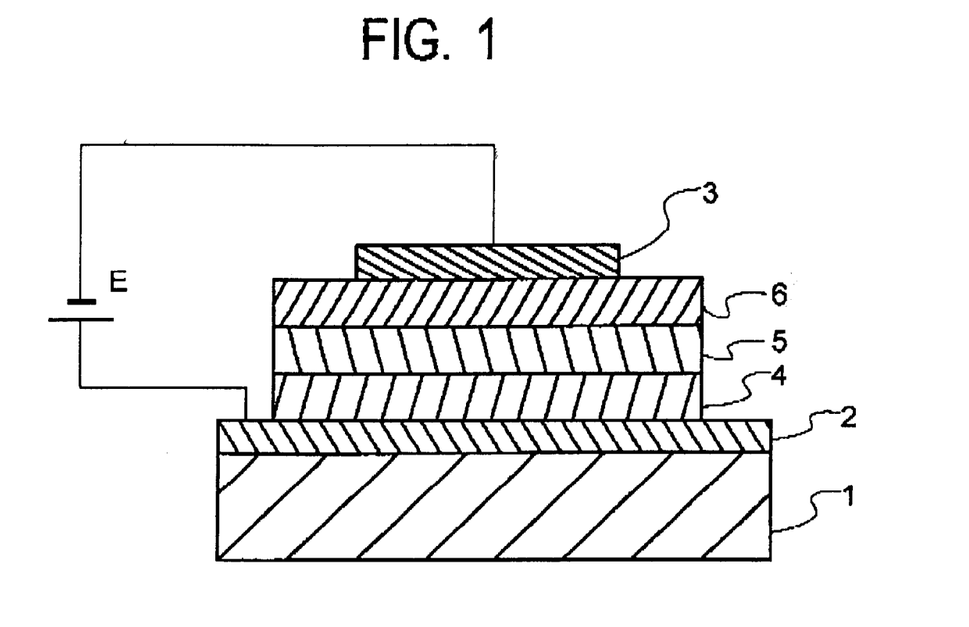
FIG. 1 is a schematic cross-sectional view illustrating an organic EL device according to an embodiment of the invention.
Figure 2:
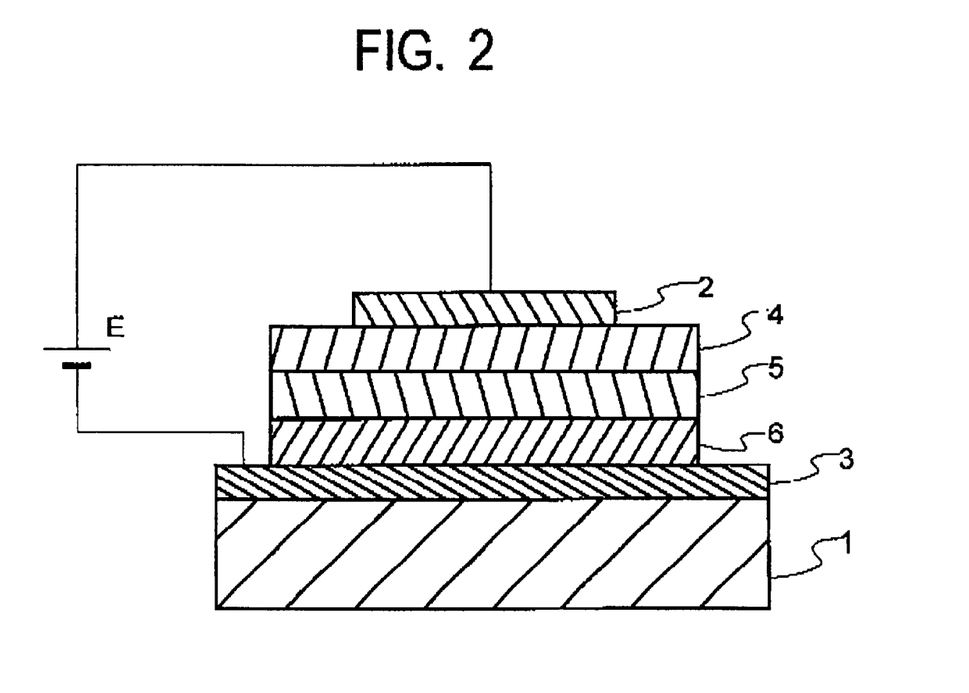
FIG. 2 is a schematic cross-sectional view illustrating an organic EL device according to another embodiment of the invention.

As shown in FIG. 1, for example, the organic EL device of the invention may have the successively stacked configuration of substrate 1/ hole injecting electrode 2/ high resistivity inorganic hole injecting layer 4/ light emitting layer 5/ inorganic insulative electron injecting and transporting layer 6/ electron injecting electrode 3. As shown in FIG. 2, for example, the organic EL device of the invention may also have the successively stacked configuration of substrate 1/ electron injecting electrode 3/ inorganic insulative electron injecting and transporting layer 6/ light emitting layer 5/ high resistivity inorganic hole injecting layer 4/ hole injecting electrode 2, which is a configuration wherein the layers are successively stacked in an order reverse to usual order of stacking. By stacking the layers in such reverse order, the light exit from the side opposite to the substrate is facilitated. It is noted that when the high resistivity inorganic hole injecting layer is deposited, the organic layer or the like can be subjected to ashing and hence, damaged. Under such a situation, it is recommended that the high resistivity electron injecting layer is deposited as two layers, that is, the layer is initially thinly deposited in the absence of oxygen and then thickly in the presence of oxygen. The thickness reached in the absence of oxygen is preferably about ⅓ to about ½ of the overall thickness. In FIGS. 1 and 2, a drive power supply E is connected between the hole injecting electrode 2 and the electron injecting electrode 3. The term light emitting layer 5 as used herein designates the light emitting layer in the broad sense, and includes electron transporting layer, the light emitting layer in the narrow sense, hole transporting layer, and the like.

The device of the invention may have a multi-stage configuration of electrode layer/inorganic layers and light emitting layer/electrode layer/inorganic layers and light emitting layer/electrode layer/inorganic layers and light emitting layer/electrode layer, or further repeated layers. Such a multi-stage configuration is effective for adjusting or multiplying the color of emitted light.

For the hole injecting electrode, materials capable of effectively injecting holes into the hole injecting layer are preferred. Useful are compositions based on tin-doped indium oxide (ITO), zinc-doped indium oxide (IZO), indium oxide ($In_2O_3$), tin oxide ($SnO_2$) or zinc oxide (ZnO). These oxides may deviate more or less from their stoichiometric compositions. For ITO, an appropriate proportion of $SnO_2$ mixed with $In_2O_3$ is about 1 to 20%, more preferably about 5 to 12% by weight. For IZO, an appropriate proportion of ZnO mixed with $In_2O_3$ is about 12 to 32% by weight. The hole injecting electrode may further contain silicon oxide ($SiO_2$). The content of silicon oxide ($SiO_2$) is preferably about 0.5 to 10% as expressed in mol percent of $SiO_2$ based on ITO.

The electrode on the light exit side should preferably have a light transmittance of at least 50%, more preferably at least 60%, further preferably at least 80%, especially at least 90% in the light emission band, typically from 400 to 700 nm, and especially at each light emission. With a lower transmittance, the light emitted by the light emitting layer is attenuated through the electrode, failing to provide a luminance necessary as a light emitting device. It is noted that the light transmittance of the electrode is sometimes set low for the purpose of increasing the contrast ratio for improving visual perception.

Preferably the electrode has a thickness of 50 to 500 nm, especially 50 to 300 nm. Although the upper limit of the electrode thickness is not critical, a too thick electrode would cause a drop of transmittance and separation. Too thin an electrode is insufficient for its effect and low in film strength during fabrication.

The negative electrode (electron injecting electrode) may comprise a material of low work function such as a simple metal element, for example, K, Li, Na, Mg, La, Ce, Ca, Sr, Ba, Al, Ag, In, Sn, Zn, or Zr, or a binary or ternary alloy containing such metal element for stability improvement. Exemplary alloys are Ag—Mg (Ag: 0.1 to 50 at %), Al—Li (Li: 0.01 to 14 at %), In—Mg (Mg: 50 to 80 at %), and Al—Ca (Ca: 0.01 to 20 at %). The electron injecting electrode layer may comprise a thin film comprising such material or a multi-layer film comprising two or more such thin film layers.

Such electron injecting electrode thin film may have at least a sufficient thickness to effect electron injection, for example, a thickness of at least 0.1 nm, preferably at least 0.5 nm, and more preferably at least 1 nm. Although the upper limit is not critical, the electrode thickness is typically about 1 to about 500 nm. On the electron injecting electrode, an auxiliary electrode (protective electrode) may be provided, if desired.

The auxiliary electrode may have at least a sufficient thickness to ensure efficient electron injection and prevent the ingress of moisture, oxygen and organic solvents, for example, a thickness of at least 50 nm, preferably at least 100 nm, more preferably 100 to 500 nm. A too thin auxiliary electrode layer would exert its effect little, lose a step coverage capability, and provide insufficient connection to a terminal electrode. If too thick, greater stresses are generated in the auxiliary electrode layer, accelerating the growth rate of dark spots.

For the auxiliary electrode, an appropriate material may be chosen in consideration of the material of the electron injecting electrode to be combined therewith. For example, low resistivity metals such as aluminum may be used when electron injection efficiency is of importance. Metal compounds such as TiN may be used when sealing is of importance.

The thickness of the electron injecting electrode and the auxiliary electrode combined is usually about 50 to about 500 nm though it is not critical.

The light emitting layer comprises stacked thin layers of one or more organic compounds which are involved in the light emitting function.

The light emitting layer has the function of injecting the holes (positive holes) and the electrons, the function of transporting such holes and electrons, and the function of producing exciter by recombination of the holes and the electrons. By using a relatively neutral compound for the light emitting layer, the electrons and the holes can be readily injected and transported at a good balance.

The thickness of the light emitting layer is not particularly limited, and may vary by the method of formation. The light emitting layer, however, may generally have a thickness of about 5 to about 500 nm, and most preferably 10 to 300 nm.

The light emitting layer of the organic EL device contains a fluorescent material that is a compound having a light emitting function. The fluorescent material may be at least one member selected from compounds as disclosed, for example, in JP-A 264692/1988, such as quinacridone, rubrene, and styryl dyes. Also, quinoline derivatives such as metal complex dyes having 8-quinolinol or a derivative thereof as the ligand such as tris(8-quinolinolato)aluminum are included as well as tetraphenylbutadiene, anthracene, perylene, coronene, and 12-phthaloperinone derivatives. Further useful are the phenylanthracene derivatives described in JP-A 12600/1996 (Japanese Patent Application No. 110569/1994) and the tetraarylethene derivatives described in JP-A 12969/1996 (Japanese Patent Application No. 114456/1994).

It is preferred to use such a compound in combination with a host material capable of light emission by itself, that is, to use the compound as a dopant. In this embodiment, the content of the compound in the light emitting layer is preferably 0.01 to 10 wt %, especially 0.1 to 5 wt %. By using the compound in combination with the host material, the light emission wavelength of the host material can be altered, allowing light emission to be shifted to a longer wavelength and improving the luminous efficiency and stability of the device.

As the host material, quinolinolato complexes are preferable, with aluminum complexes having 8-quinolinol or a derivative thereof as the ligand being more preferable. These aluminum complexes are disclosed in JP-A 264692/1988, 255190/1991, 70733/1993, 258859/1993 and 215874/1994.

Illustrative examples include tris(8-quinolinolato) aluminum, bis(8-quinolinolato)magnesium, bis(benzo{f}-8-quinolinolato)zinc, bis(2-methyl-8-quinolinolato)aluminum oxide, tris(8-quinolinolato)indium, tris(5-methyl-8-quinolinolato)aluminum, 8-quinolinolatolithium, tris(5 chloro-8-quinolinolato)gallium, bis(5-chloro-8-quinolinolato)calcium, 5,7-dichloro-8-quinolinolatoaluminum, tris(5,7-dibromo-8-hydroxyquinolinolato)aluminum, and poly[zinc(II)-bis(8-hydroxy-5-quinolinyl)methane].

Also useful are aluminum complexes having another ligand in addition to 8-quinolinol or a derivative thereof. Examples include bis(2-methyl-8-quinolinolato)(phenolato) aluminum(III), bis(2-methyl-8-quinolinolato) (orthocresolato)aluminum(III), bis(2-methyl-8-quinolinolato)(metacresolato)aluminum(III), bis(2-methyl-8-quinolinolato)(paracresolato)aluminum(III), bis(2-methyl-8-quinolinolato)(ortho-phenylphenolato)aluminum (III), bis(2-methyl-8-quinolinolato)(meta-phenylphenolato) aluminum(III), bis(2 methyl-8-quinolinolato)(para-phenylphenolato)aluminum(III), bis(2-methyl-8-quinolinolato)(2,3-dimethylphenolato)aluminum(III), bis(2-methyl-8-quinolinolato)(2,6-dimethylphenolato)aluminum (III), bis(2-methyl-8-quinolinolato)(3,4-dimethylphenolato) aluminum(III), bis(2-methyl-8 quinolinolato)(3,5-dimethylphenolato)aluminum(III), bis(2 methyl-8-quinolinolato)(3,5-di-tert-butylphenolato) aluminum(III), bis(2-methyl-8-quinolinolato)(2,6-diphenylphenolato) aluminum(III), bis(2-methyl-8-quinolinolato) (2,4,6-triphenylphenolato)aluminum(III), bis(2-methyl-8- quinolinolato) (2,3,6-trimethylphenolato)aluminum(III), bis (2-methyl-8-quinolinolato)(2,3,5,6-tetramethylphenolato) aluminum(III), bis(2-methyl-8-quinolinolato)(1-naphtholato)aluminum(III), bis(2-methyl-8-quinolinolato) (2-naphtholato)aluminum(III), bis(2,4-dimethyl-8-quinolinolato)(orthophenylphenolato)aluminum(III), bis(2,4-dimethyl-8-quinolinolato)(para-phenylphenolato) aluminum(III), bis(2,4-dimethyl-8-quinolinolato)(meta-phenylphenolato)aluminum(III), bis(2,4-dimethyl-8-quinolinolato)(3,5-dimethylphenolato)aluminum(III), bis(2, 4-dimethyl-8-quinolinolato)(3,5-di-tert-butylphenolato) aluminum(III), bis(2-methyl-4-ethyl-8-quinolinolato)(para-cresolato)aluminum(III), bis(2-methyl-4-methoxy-8-quinolinolato)(paraphenylphenolato)aluminum(III), bis(2-methyl-5-cyano-8-quinolinolato)(ortho-cresolato)aluminum (III), and bis(2 methyl-6-trifluoromethyl-8-quinolinolato) (2-naphtholato)aluminum(III).

Also acceptable are bis(2-methyl-8-quinolinolato) aluminum(III)-$\mu$-oxo-bis(2-methyl-8-quinolinolato) aluminum (III), bis(2,4-dimethyl-8-quinolinolato)aluminum (III)-$\mu$-oxo-bis(2,4-dimethyl-8-quinolinolato)aluminum (III), bis(4-ethyl2-methyl-8-quinolinolato)aluminum(III)-$\mu$-oxo-bis(4-ethyl-2-methyl-8-quinolinolato)aluminum(III), bis(2-methyl-4 methoxyquinolinolato)aluminum(III)-$\mu$-oxo-bis(2-methyl-4 methoxyquinolinolato)aluminum(III), bis(5-cyano-2-methyl-8-quinolinolato)aluminum(III)-$\mu$-oxo-bis(5-cyano-2-methyl-8-quinolinolato)aluminum(III), and bis(2-methyl-5 trifluoromethyl-8-quinolinolato) aluminum(III)-$\mu$-oxo-bis(2-methyl-5-trifluoromethyl-8-quinolinolato)aluminum(III).

Other useful host materials are the phenylanthracene derivatives described in JP-A 12600/1996 (Japanese Patent Application No. 110569/1994) and the tetraarylethene derivatives described in JP-A 12969/1996 (Japanese Patent Application No. 114456/1994).

The light emitting layer may also serve as the electron injecting and transporting layer. In this case, tris(8-quinolinolato)aluminum etc. are preferably used. These fluorescent materials may be evaporated.

Also, if necessary, the light emitting layer may also be a layer of a mixture of at least one hole injecting and transporting compound and at least one electron injecting and transporting compound, in which a dopant is preferably contained. In such a mix layer, the content of the compound is preferably 0.01 to 20 wt %, especially 0.1 to 15 wt %.

In the mix layer, carrier hopping conduction paths are created, allowing carriers to move through a polarly predominant material while injection of carriers of opposite polarity is rather inhibited, and the organic compound becomes less susceptible to damage, resulting in the advantage of an extended device life. By incorporating the aforementioned dopant in such a mix layer, the light emission wavelength the mix layer itself possesses can be altered, allowing light emission to be shifted to a longer wavelength and improving the luminous intensity and stability of the device.

The hole injecting and transporting compound and electron injecting and transporting compound used in the mix layer may be selected from the hole injecting and transporting compounds and the electron injecting and transporting compounds to be described later, respectively. Inter alia, the hole injecting and transporting compound is preferably selected from amine derivatives having strong fluorescence, for example, triphenyldiamine derivatives which are hole transporting materials, styrylamine derivatives and amine derivatives having an aromatic fused ring.

The electron injecting and transporting compound is preferably selected from quinoline derivatives and metal complexes having 8-quinolinol or a derivative thereof as a ligand, especially tris(8-quinolinolato)aluminum (Alq3). The aforementioned phenylanthracene derivatives and tetraarylethene derivatives are also preferable.

As the hole injecting and transporting compound, amine derivatives having intense fluorescence are useful, for example, the triphenyldiamine derivatives, styrylamine derivatives, and amine derivatives having an aromatic fused ring, exemplified above as the hole injecting and transporting material.

The mix ratio is preferably determined in accordance with the carrier density and carrier mobility of the respective compounds. It is usually preferred that the weight ratio of the hole injecting and transporting compound to the electron injecting and transporting compound range from about 1/99 to about 99/1, more preferably from about 10/90 to about 90/10, especially from about 20/80 to about 80/20.

Also preferably, the thickness of the mix layer ranges from the thickness of a mono-molecular layer to less than the thickness of the organic compound layer. Specifically, the mix layer is preferably 1 to 85 nm, more preferably 5 to 60 nm, especially 5 to 50 nm thick.

Preferably the mix layer is formed by a co-deposition process of evaporating the compounds from distinct sources. If both the compounds have approximately equal or very close vapor pressures or evaporation temperatures, they may be pre-mixed in a common evaporation boat, from which they are evaporated together. The mix layer is preferably a uniform mixture of both the compounds although the compounds can be present in island form. The light emitting layer is generally formed to a predetermined thickness by evaporating an organic fluorescent material or coating a dispersion thereof in a resin binder.

In forming the light emitting layer, vacuum evaporation is preferably used because homogeneous thin films are available. By utilizing vacuum evaporation, there is obtained a homogeneous thin film which is amorphous or has a crystal grain size of up to 0.2 $\mu$m. If the grain size is in excess of 0.2 $\mu$m, uneven light emission would take place and the drive voltage of the device must be increased with a substantial drop of hole injection efficiency.

The conditions for vacuum evaporation are not critical although a vacuum of $10^{-4}$ Pa or lower and a deposition rate of about 0.01 to 1 nm/sec. are preferred. It is preferred to successively form layers in vacuum because the successive formation in vacuum can avoid adsorption of impurities on the interface between the layers, thus ensuring better performance. Also, the drive voltage of a device can be reduced and the development and growth of dark spots be restrained.

In the embodiment wherein the respective layers are formed by vacuum evaporation, where it is desired for a single layer to contain two or more compounds, it is preferable that the boats having the compounds received therein are individually temperature controlled to achieve co-deposition.

It should be noted that, a hole transporting layer and an electron transporting layer may be optionally formed by using the hole injecting and transporting compounds and the electron injecting and transporting compounds as described above, respectively.

Further preferably, a shield plate may be provided on the device in order to prevent the organic layers and electrodes from oxidation. In order to prevent the ingress of moisture, the shield plate is attached to the substrate through an adhesive resin layer for sealing. The sealing gas is preferably an inert gas such as argon, helium, and nitrogen. The sealing gas should preferably have a moisture content of less than 100 ppm, more preferably less than 10 ppm, especially less than 1 ppm. The lower limit of the moisture content is usually about 0.1 ppm though not critical.

The shield plate is selected from plates of transparent or translucent materials such as glass, quartz and resins, with glass being especially preferred. Alkali glass is preferred because of economy although other glass compositions such as soda lime glass, lead alkali glass, borosilicate glass, aluminosilicate glass, and silica glass are also useful. Of these, plates of soda glass without surface treatment are inexpensive and useful. Beside the glass plates, metal plates and plastic plates may also be used as the shield plate.

Using a spacer for height adjustment, the shield plate may be held at a desired height over the layer structure. The spacer may be formed from resin beads, silica beads, glass beads, and glass fibers, with the glass beads being especially preferred. Usually the spacer is formed from particles having a narrow particle size distribution while the shape of particles is not critical. Particles of any shape which does not obstruct the spacer function may be used. Preferred particles have an equivalent circle diameter of about 1 to 20 $\mu$m, more preferably about 1 to 10 $\mu$m, most preferably about 2 to 8 $\mu$m. Particles of such diameter should preferably have a length of less than about 100 $\mu$m. The lower limit of length is not critical although it is usually equal to or more than the diameter.

When a shield plate having a recess is used, the spacer may be used or not. When used, the spacer should preferably have a diameter in the above-described range, especially 2 to 8 $\mu$M.

The spacer may be premixed in a sealing adhesive or mixed with a sealing adhesive at the time of bonding. The content of the spacer in the sealing adhesive is preferably 0.01 to 30 wt %, more preferably 0.1 to 5 wt %.

Any of adhesives which can maintain stable bond strength and gas tightness may be used although UV curable epoxy resin adhesives of cation curing type are preferred.

In the organic EL structure of the invention, the substrate may be selected from amorphous substrates of glass and quartz and crystalline substrates of Si, GaAs, ZnSe, ZnS, GaP, and InP, for example. If desired, buffer layers of crystalline materials, amorphous materials or metals may be formed on such crystalline substrates. Metal substrates including Mo, Al, Pt, Ir, Au and Pd are also useful. Of these, glass substrates are preferred. Since the substrate is often situated on the light exit side, the substrate should preferably have a light transmittance as described above for the electrode.

A plurality of inventive devices may be arrayed on a plane. A color display is obtained when the respective devices of a planar array differ in emission color.

The substrate may be provided with a color filter film, a fluorescent material-containing color conversion film or a dielectric reflecting film for controlling the color of light emission.

The color filter film used herein may be a color filter as used in liquid crystal displays and the like. The properties of a color filter may be adjusted in accordance with the light emission of the organic EL device so as to optimize the extraction efficiency and color purity.

It is also preferred to use a color filter capable of cutting external light of short wavelength which is otherwise absorbed by the EL device materials and fluorescence conversion layer, because the light resistance and display contrast of the device are improved.

An optical thin film such as a multilayer dielectric film may be used instead of the color filter.

The fluorescence conversion filter film is to convert the color of light emission by absorbing electroluminescence and allowing the fluorescent material in the film to emit light. It is formed from three components: a binder, a fluorescent material, and a light absorbing material.

The fluorescent material used may basically have a high fluorescent quantum yield and desirably exhibits strong absorption in the electroluminescent wavelength region. In practice, laser dyes are appropriate. Use may be made of rhodamine compounds, perylene compounds, cyanine compounds, phthalocyanine compounds (including subphthalocyanines), naphthalimide compounds, fused ring hydrocarbon compounds, fused heterocyclic compounds, styryl compounds, and coumarin compounds.

The binder is selected from materials which do not cause extinction of fluorescence, preferably those materials which can be finely patterned by photolithography or printing technique. Also, where the filter film is formed on the substrate so as to be contiguous to the hole injecting electrode, those materials which are not damaged during deposition of the hole injecting electrode (such as ITO or IZO) are preferable.

The light absorbing material is used when the light absorption of the fluorescent material is short and may be omitted if unnecessary. The light absorbing material may also be selected from materials which do not cause extinction of fluorescence of the fluorescent material.

The organic EL device of the invention is generally of the dc or pulse drive type. The applied voltage is generally about 2 to 30 volts.

In addition to the display application, the organic EL device of the invention may find use as various optical devices such as optical pickups for use in reading and writing in storages, repeaters in transmission lines for optical communication, and photo couplers.

EXAMPLES

Examples of the invention are given below by way of illustration.

Example 1

A glass substrate (manufactured by Corning Glass Works under the designation of 7059) was scrubbed using a neutral detergent.

By RF magnetron sputtering from a target of ITO oxide, a hole injecting electrode layer of ITO having a thickness of 200 nm was formed on the substrate at a substrate temperature of 250° C.

After its ITO electrode-bearing surface was cleaned with $UV/O_3$, the substrate was secured by a holder in a sputtering chamber, which was evacuated to a vacuum of $1 \times 10^{-4}$ Pa or lower.

Next, using a target of $SiO_2$ and Au pellet of the predetermined size placed on the $SiO_2$ target, a high resistivity inorganic hole injecting layer was deposited to a thickness of 20 nm. The sputtering gas used was a mixture of Ar at 30 SCCM and $O_2$ at 5 SCCM. The sputtering was conducted at room temperature (25° C.), a deposition rate of 1 nm/min, an operating pressure of 0.2 to 2 Pa, and an input power of 500 W. The inorganic hole injecting layer as deposited had a composition of $SiO_{1.9}$ and 4 mol % of Au.

With the vacuum kept, N,N,N',N'-tetrakis(m-biphenyl)1,1'-biphenyl-4,4'-diamine (TPD), tris(8-quinolinolato) aluminum (Alq3), and rubrene were evaporated at an overall deposition rate of 0.2 nm/sec to a thickness of 100 nm, forming a light emitting layer. The layer consisted of a mixture of TPD and Alq3 at a TPD:Alq3 of 1:1 (volume ratio). The layer was doped with 10 vol % of rubrene.

The substrate was then moved to a sputtering apparatus wherein the inorganic electron injecting and transporting layer was deposited by using a target prepared by mixing the raw materials of strontium oxide (SrO), lithium oxide ($Li_2O$), and silicon oxide ($SiO_2$) in the proportion:

SrO: 80 mol %,
$Li_2O$: 10 mol %
$SiO_2$: 10 mol %, based on the entire components. The inorganic electron injecting and transporting layer was formed to a thickness of 0.8 nm. The deposition conditions of the inorganic electron injecting and transporting layer included a substrate temperature of 25° C., a sputtering gas of Ar, a deposition rate of 1 nm/min, an operating pressure of 0.5 Pa, and an input power of 5 $W/cm^2$. In the formation of the inorganic electron injecting and transporting layer, the layer was first deposited to a thickness of 0.4 nm by using a sputtering gas of 100% Ar at 100 SCCM, and then forming the layer of 0.4 nm thick by using $Ar/O_2$ of 1/1 fed at 100 SCCM.

Next, with the vacuum kept, Al was evaporated to a thickness of 20 nm to form the negative electrode. Final sealing of a glass shield completed an organic EL device.

The resulting EL device was evaluated by driving the device in air at a constant current density of 10 $mA/cm^2$. The initial luminance was 770 $cd/m^2$, and drive voltage was 7.8 V.

Sheet resistance of the high resistivity inorganic electron injecting layer evaluated by four terminal method was 10 $k\Omega/cm^2$ at a thickness of 100 nm, and this resistance corresponds to the resistivity of $1 \times 10^9$ $\Omega \cdot cm$.

Example 2

An organic EL device was fabricated as in Example 1 except that, in the step of depositing the high resistivity inorganic hole injecting layer, the sputtering was conducted by using a target of $GeO_2$ and Au pellet of the predetermined size placed on the $GeO_2$ target, and depositing the high resistivity inorganic hole injecting layer to a thickness of 20 nm. The sputtering gas used was a mixture of Ar at 30 SCCM and $O_2$ at 5 SCCM. The sputtering was conducted at room temperature (25° C.), a deposition rate of 1 nm/min, an operating pressure of 0.2 to 2 Pa, and an input power of 500 W. The inorganic hole injecting layer as deposited had a composition of $GeO_2$ containing 2 mol % of Au.

Other conditions for producing the organic EL device were the same as those of Example 1. When the resulting organic EL device was evaluated by driving the device in air at a constant current density of 10 $mA/cm^2$, the initial luminance was 880 $cd/m^2$, and drive voltage was 6.9 V.

Sheet resistance of the high resistivity inorganic electron injecting layer evaluated by four terminal method was 100 $k\Omega/cm^2$ at a thickness of 100 nm, and this resistance corresponds to the resistivity of $1 \times 10^7$ $\Omega \cdot cm$.

Example 3

Organic EL devices were fabricated as in Examples 1 and 2 except that in the step of depositing the high resistivity inorganic hole injecting and transporting layer, the flow rate of $O_2$ in the sputtering gas was changed and the target used was changed in accordance with the desired layer composition so that the resulting layers had the compositions $SiO_{1.7}$, $SiO_{1.95}$, $GeO_{1.96}$, and $Si_{0.5}Ge_{0.5}O_{1.92}$, respectively. The devices were tested for emission luminance, obtaining substantially equivalent results.

Example 4

In Example 1, the results were also equivalent when the metal constituting the high resistivity inorganic hole injecting layer was changed from Au to at least a member selected from Cu, Fe, Ni, Ru, Sn, Cr, Ir, Nb, Pt, W, Mo, Ta, Pd, and Co, a semimetal, or an oxide thereof.

Example 5

In Example 1, the main component and stabilizer of the inorganic electron injecting and transporting layer were changed from SrO to MgO, CaO or an oxide mixture thereof; from $Li_2O$ to $K_2O$, $Rb_2O$, $K_2O$, $Na_2O$, $Cs_2O$, or an oxide mixture thereof; and from $SiO_2$ to $GeO_2$ or an oxide mixture of $SiO_2$ and $GeO_2$, respectively, with substantially equivalent results. The results were also equivalent when Al constituting the negative electrode was replaced with Ag, In, Ti, Cu, Au, Mo, W, Pt, Pd, Ni, or an alloy thereof.

Comparative Example 1

In Example 1, the high resistivity inorganic hole injecting layer was formed to a thickness of 1 nm by using a target comprising $SiO_2$. The sputtering was conducted by using a sputtering gas containing $O_2$ and 5% of Ar, and at room temperature (25° C.), a deposition rate of 1 nm/min, an operating pressure of 0.5 Pa, an input power of 5 $W/cm^2$. The resulting inorganic hole injecting layer had the composition of $SiO_{1.9}$.

Other conditions for producing the organic EL device were the same as those of Example 1. When the resulting organic EL device was evaluated by driving the device in air at a constant current density of 10 $mA/cm^2$, the initial luminance was 500 $cd/m^2$, and drive voltage was 10 V.

When the inorganic hole injecting layer was deposited to 10 nm, and the device was evaluated at a constant current density of 10 $mA/cm^2$, the initial luminance was 1 $cd/m^2$, and drive voltage was 18 V.

BENEFITS OF THE INVENTION

As described above, there is realized according to the present invention an organic EL device having an excellent electron and hole injecting efficiency and improved light emitting efficiency, which can be manufactured at reduced cost and which can be operated at low drive voltage.

What is claimed is:

1. An organic electroluminescent device comprising a hole injecting electrode, a negative electrode, and at least one organic layer between the electrodes; wherein at least one of said at least one organic layer has a light emitting function;

a high resistivity inorganic hole injecting layer is provided between said hole injecting electrode and said organic layer, said high resistivity inorganic hole injecting layer having conductive paths for electron blockage and hole transportation; and an inorganic insulative electron injecting and transporting layer is provided between said organic layer and said negative electrode, said inorganic insulative electron injecting and transporting layer containing at least one oxide selected from strontium oxide, magnesium oxide, calcium oxide, lithium oxide, rubidium oxide, potassium oxide, sodium oxide and cesium oxide as its main component, wherein said high resistivity inorganic hole injecting layer has a resistivity of 1 to $1 \times 10^{11}$ $\Omega \cdot cm$.

2. The organic electroluminescent device of claim 1 wherein said high resistivity inorganic hole injecting layer contains at least one member selected from a metal and/or its oxide, carbide, nitride, silicate and boride.

3. The organic electroluminescent device of claim 1 wherein said high resistivity inorganic hole injecting layer comprises oxide of silicon and/or germanium as its main component, said main component having a composition represented by:

$$(Si_{1-x}Ge_x)O_y$$

wherein $0 \leq x \leq 1$ and $1.7 \leq y \leq 2.2$, and said high resistivity inorganic hole injecting layer further comprises a metal having a work function of at least 4.5 eV or oxide thereof.

4. The organic electroluminescent device of claim 3 wherein said metal is at least one member selected from Au, Cu, Fe, Ni, Ru, Sn, Cr, Ir, Nb, Pt, W, Mo, Ta, Pd and Co.

5. The organic electroluminescent device of claim 3 wherein content of said metal and/or said metal oxide in said high resistivity inorganic hole injecting layer is in the range of 0.2 to 40 mol %.

6. The organic electroluminescent device of claim 1 wherein said high resistivity inorganic hole injecting layer has a thickness of 1 to 100 nm.

7. The organic electroluminescent device of claim 1 wherein said inorganic insulative electron injecting and transporting layer comprises a main component oxide and a stabilized oxide, which comprises 80 to 99 mol % of the main component, and 1 to 20 mol % of the stabilized oxide, based on the entire components.

8. The organic electroluminescent device of claim 1 wherein said inorganic insulative electron injecting and transporting layer has a thickness of 0.1 to 2 nm.

* * * * *